United States Patent
Sohn et al.

(10) Patent No.: US 12,364,092 B2
(45) Date of Patent: Jul. 15, 2025

(54) ELECTROLUMINESCENT DISPLAY DEVICE INCLUDING A RED PIXEL, A GREEN PIXEL, AND A BLUE PIXEL

(71) Applicant: Samsung Electronics Co., Ltd., Suwon-si (KR)

(72) Inventors: Sanghyun Sohn, Suwon-si (KR); Eun Joo Jang, Suwon-si (KR); Tae Hyung Kim, Seoul (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 665 days.

(21) Appl. No.: 17/696,956

(22) Filed: Mar. 17, 2022

(65) Prior Publication Data
US 2022/0302402 A1    Sep. 22, 2022

(30) Foreign Application Priority Data
Mar. 18, 2021 (KR) .................... 10-2021-0035491

(51) Int. Cl.
*H10K 50/115* (2023.01)
*H10K 50/125* (2023.01)

(52) U.S. Cl.
CPC ......... *H10K 50/115* (2023.02); *H10K 50/125* (2023.02)

(58) Field of Classification Search
CPC .......................... H10K 50/115; H10K 50/125
See application file for complete search history.

(56) References Cited

U.S. PATENT DOCUMENTS

| 9,653,630 B2 | 5/2017 | Suh et al. |
| 10,673,004 B2 | 6/2020 | Kim et al. |

(Continued)

FOREIGN PATENT DOCUMENTS

| CN | 110010782 A | 7/2019 |
| KR | 20120048118 A | 5/2012 |

(Continued)

OTHER PUBLICATIONS

Office Action dated Nov. 6, 2024 of the corresponding Korean Patent Application No. 10-2021-0035491.

*Primary Examiner* — Nelson Garces
(74) *Attorney, Agent, or Firm* — CANTOR COLBURN LLP

(57) ABSTRACT

An electroluminescent display device includes first and second electrode facing each other; and a quantum dot emission layer disposed between the first and second electrodes, wherein the quantum dot emission layer includes a red emission layer disposed in a red pixel, a green emission layer disposed in a green pixel, and a blue emission layer disposed in a blue pixel, wherein the red emission layer includes red light emitting quantum dots, the green emission layer includes green light emitting quantum dots, the blue emission layer includes blue light emitting quantum dots, and wherein the blue emission layer is configured to exhibit first emission spectrum including a blue luminescent peak and a first luminescent peak different from the blue luminescent peak, wherein the green emission layer is configured to exhibit a second emission spectrum including a green luminescent peak and a second luminescent peak different from the green luminescent peak.

20 Claims, 4 Drawing Sheets

(56) References Cited

U.S. PATENT DOCUMENTS

| | | |
|---|---|---|
| 11,011,721 B2 | 5/2021 | Kim et al. |
| 2006/0227837 A1 | 10/2006 | Lee et al. |
| 2014/0014896 A1 | 1/2014 | Chung et al. |
| 2022/0416186 A1* | 12/2022 | Takenaka ............. H10K 50/115 |

FOREIGN PATENT DOCUMENTS

| | | |
|---|---|---|
| KR | 20180129419 A | 12/2018 |
| KR | 20190106824 A | 9/2019 |
| KR | 20210001995 A | 1/2021 |

\* cited by examiner

ELECTROLUMINESCENT DISPLAY DEVICE INCLUDING A RED PIXEL, A GREEN PIXEL, AND A BLUE PIXEL

CROSS-REFERENCE TO RELATED APPLICATION

This application claims priority to and the benefit of Korean Patent Application No. 10-2021-0035491, filed in the Korean Intellectual Property Office on Mar. 18, 2021, and all the benefits accruing therefrom under 35 U.S.C. § 119, the entire content of which is incorporated herein by reference.

BACKGROUND

1. Field

An electroluminescent display device is disclosed.

2. Description of the Related Art

A luminescent nanostructure (hereinafter, referred to as a "quantum dot") is a semiconductor material having a nano-scale size, e.g., a size of several nanometers. The quantum dot may exhibit a quantum confinement effect. The quantum dot may emit light as an electron in an excited energy state, e.g., by irradiation from a light source or with electrical energy, e.g., an applied electric current, is transferred, e.g., returns to a non-excited energy state. By controlling a size of the quantum dot, a composition of the quantum dot, or a combination thereof, a wavelength of the lighted emitted from quantum dot may be controlled.

An electroluminescent display device including quantum dots may be used in a display device. Light emission may be induced by application of a voltage resulting in a radiative recombination of excited charges generated between layers of the device.

SUMMARY

An embodiment provides a luminescent display device including luminescent nanostructure (e.g., quantum dot) by the application of the electrical voltage.

An embodiment provides a display device including luminescent nanostructures (e.g., quantum dots) in a red pixel, a green pixel, a blue pixel, or a combination thereof as a light emitting material, for example, a quantum dot-liquid emitting diode (QD-LED) display device.

In an embodiment, an electroluminescent display device includes a red pixel, a green pixel, and a blue pixel, wherein the device includes:
a first electrode and a second electrode facing each other; and
a quantum dot emission layer disposed between the first electrode and the second electrode, the quantum dot emission layer not including cadmium,
wherein the quantum dot emission layer includes a red emission layer including red light emitting quantum dots, the red emission layer disposed in a red pixel, a green emission layer including green light emitting quantum dots, the green emission layer disposed in a green pixel, and a blue emission layer including blue light emitting quantum dots, the blue emission layer disposed in a blue pixel,
wherein the blue emission layer is configured to exhibit a first emission spectrum including a blue luminescent peak and a first luminescent peak different from the blue luminescent peak, and a first wavelength difference between the first luminescent peak and the blue luminescent peak is greater than or equal to about 20 nanometers (nm) and less than or equal to about 150 nm, or
wherein the green emission layer is configured to exhibit a second emission spectrum including a green luminescent peak and a second luminescent peak different from the green luminescent peak, and a second wavelength difference between the second luminescent peak and the green luminescent peak is greater than or equal to about 10 nm and less than or equal to about 150 nm (or less than or equal to about 100 nm).

In an embodiment, (for example, on an application of a voltage) the blue emission layer is configured to exhibit a first emission spectrum including a blue luminescent peak and a first luminescent peak different from the blue luminescent peak, and a first wavelength difference between the first luminescent peak and the blue luminescent peak is greater than or equal to about 20 nm and less than or equal to about 150 nm, and the green emission layer is configured to exhibit a second emission spectrum including a green luminescent peak and a second luminescent peak different from the green luminescent peak, and a second wavelength difference between the second luminescent peak and the green luminescent peak is greater than or equal to about 10 nm and less than or equal to about 150 nm (or less than or equal to about 100 nm).

The first wavelength difference between the first luminescent peak and the blue luminescent peak may be greater than or equal to about 30 nm, greater than or equal to about 40 nm, or greater than or equal to about 50 nm. The first wavelength difference between the first luminescent peak and the blue luminescent peak may be less than or equal to about 120 nm, less than or equal to about 100 nm, less than or equal to about 90 nm, less than or equal to about 80 nm, or less than or equal to about 70 nm.

A wavelength of the first luminescent peak may be greater than a wavelength of the blue luminescent peak.

The second wavelength difference between the second luminescent peak and the green luminescent peak may be greater than or equal to about 20 nm, greater than or equal to about 30 nm, greater than or equal to about 40 nm, or greater than or equal to about 50 nm. The second wavelength difference between the second luminescent peak and the green luminescent peak may be less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm.

A wavelength of the second luminescent peak may be greater than a wavelength of the green luminescent peak. A wavelength of the second luminescent peak may be less than a wavelength of the green luminescent peak.

An intensity ratio of the first luminescent peak to the blue luminescent peak may be greater than or equal to about 0.05:1, greater than or equal to about 0.1:1, or greater than or equal to about 0.15:1.

An intensity ratio of the first luminescent peak to the blue luminescent peak may be less than or equal to about 0.6:1, less than or equal to about 0.3:1, less than or equal to about 0.2:1, or less than or equal to about 0.15:1.

The blue emission layer may exhibit a Cx value of greater than equal to about 0.14 and less than or equal to about 0.18.

The blue emission layer may exhibit a Cy value of greater than or equal to about 0.06 and less than or equal to about 0.11.

The blue emission layer may further include a plurality of first quantum dots that are configured to emit a light exhibiting the first luminescent peak.

The first quantum dots may have a composition different from the blue light emitting quantum dots.

The blue light emitting quantum dots may include a zinc chalcogenide including tellurium. The blue light emitting quantum dots may have a core shell structure including a semiconductor nanocrystal core including zinc, tellurium, and selenium, and a semiconductor nanocrystal shell disposed on the surface of the semiconductor nanocrystal core, the shell having a composition different from the semiconductor nanocrystal core.

In the blue light emitting quantum dots, a mole ratio of tellurium to selenium (Te:Se) may be less than or equal to about 0.1:1, less than or equal to about 0.05:1, less than or equal to about 0.03:1, less than or equal to about 0.02:1, or less than or equal to about 0.01:1.

The plurality of the first quantum dots may be configured to emit green light.

The plurality of the first quantum dots (or core included therein) may include a Group III-V compound including indium and phosphorus, and optionally further including zinc; or a zinc selenide telluride ($ZnTe_ySe_{1-y}$) (wherein y is greater than or equal to about 0.3, greater than or equal to about 0.4, greater than or equal to about 0.5, or greater than or equal to about 0.6, and less than or equal to about 0.9, less than or equal to about 0.8, less than or equal to about 0.7); or a zinc telluride; or a combination thereof.

The first quantum dots may have a core shell structure including a first semiconductor core including indium and phosphorus, and optionally further including zinc, and a first semiconductor shell including a Group II-VI compound.

The first quantum dots may include zinc, selenium, and tellurium, and in the first quantum dots, a mole ratio of tellurium to selenium (Te:Se) may be greater than or equal to about 0.03:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.4:1; less than or equal to about 0.9:1, less than or equal to about 0.8:1, less than or equal to about 0.7:1, less than or equal to about 0.6:1, less than or equal to about 0.5:1, less than or equal to about 0.4:1, or less than or equal to about 0.3:1; or a combination thereof.

In the blue emission layer, the blue light emitting quantum dots and the first quantum dots may be mixed at random (e.g., randomly in a thickness or plane direction or not divided in, e.g., into, separate layers or separate sections).

The green emission layer may further include a second quantum dot(s) that is configured to emit a light exhibiting the second luminescent peak, the second quantum dot having a composition different from the green light emitting quantum dots.

The second quantum dot(s) may include a green light emitting quantum dot(s) or a blue light emitting quantum dot(s).

In the green emission layer, the green light emitting quantum dots or the second quantum dots may include a Group III-V compound including indium and phosphorus, and optionally further including zinc; or a zinc selenide telluride for example represented by $ZnTe_ySe_{1-y}$ (wherein y is greater than or equal to about 0.3, greater than or equal to about 0.4, greater than or equal to about 0.5, or greater than or equal to about 0.6, and less than or equal to about 0.9, less than or equal to about 0.8, or less than or equal to about 0.7); or a zinc telluride; or a combination thereof.

The green light emitting quantum dots or the second quantum dots may have a core shell structure, the core shell structure including a semiconductor nanocrystal core and a semiconductor nanocrystal shell disposed on the semiconductor nanocrystal core and having a different composition than the semiconductor nanocrystal core.

The semiconductor nanocrystal core may include a zinc selenide telluride, a Group III-V compound, or a combination thereof. The semiconductor nanocrystal shell may include a zinc chalcogenide.

An intensity ratio of the second luminescent peak to the green luminescent peak may be greater than or equal to about 0.05:1, greater than or equal to about 0.1:1, greater than or equal to about 0.15:1, greater than or equal to about 0.2:1, or greater than or equal to about 0.25:1.

An intensity ratio of the second luminescent peak to the green luminescent peak may be less than or equal to about 0.6:1, less than or equal to about 0.5:1, less than or equal to about 0.3:1, less than or equal to about 0.25:1, less than or equal to about 0.2:1, less than or equal to about 0.15:1, or less than or equal to about 0.1:1.

In the green emission layer, the green light emitting quantum dots and the second quantum dots may be mixed at random (e.g., randomly in a thickness or plane direction or not divided in, e.g., into, separate layers or separate sections).

In the display device of an embodiment, a maximum luminance (or a maximum brightness) of a pixel (or green light or blue light) may be greater than or equal to about 36,000 candelas per square meter ($cd/m^2$), greater than or equal to about 40,000 $cd/m^2$, greater than or equal to about 100,000 $cd/m^2$, greater than or equal to about 110,000 $cd/m^2$, greater than or equal to about 120,000 $cd/m^2$, greater than or equal to about 130,000 $cd/m^2$, greater than or equal to about 140,000 $cd/m^2$, or greater than or equal to about 150,000 $cd/m^2$.

In the display device of an embodiment, a maximum luminance (or a maximum brightness) of the green pixel (or green light) may be greater than or equal to about 100,000 $cd/m^2$, greater than or equal to about 110,000 $cd/m^2$, greater than or equal to about 120,000 $cd/m^2$, greater than or equal to about 130,000 $cd/m^2$, greater than or equal to about 140,000 $cd/m^2$, or greater than or equal to about 150,000 $cd/m^2$.

In the display device of an embodiment, a maximum luminance (or a maximum brightness) of the blue pixel (or green light) may be greater than or equal to about 36,000 $cd/m^2$, or greater than or equal to about 40,000 $cd/m^2$.

The display device of an embodiment may exhibit a maximum external quantum efficiency of greater than or equal to about 9%, or greater than or equal to about 9.5%.

In the display device of an embodiment, the blue pixel (or the blue light emission layer) may show, e.g., exhibit, a maximum external quantum efficiency (EQE) of greater than or equal to about 9%, or greater than or equal to about 9.5%.

A charge auxiliary layer may be disposed between the first electrode and the quantum dot emission layer, between the second electrode and the quantum dot emission layer, or between the first electrode and the quantum dot emission layer and between the second electrode and the quantum dot emission layer.

In the display device, the first electrode may include an anode, a hole injection layer, a hole transporting layer, an electron blocking layer, or a combination thereof may be disposed between the first electrode and the quantum dot emission layer.

In the display device, the second electrode may include a cathode, an electron injection layer, an electron transporting layer, a hole blocking layer, or a combination thereof may be disposed between the second electrode and the quantum dot emission layer.

In an embodiment, a blue emission layer includes blue light emitting quantum dots including zinc, selenium, sulfur, and tellurium, wherein in the blue light emitting quantum dots a mole ratio of tellurium to selenium is from about 0.004:1 to about 0.025:1, selenium to zinc is from about 0.2:1 to about 0.4:1, tellurium to zinc is from about 0.009:1 to about 0.005:1, sulfur to zinc is from about 0.3:1 to about 0.6:1, sulfur and selenium to zinc is from about 0.8:1 to about 1:1, and sulfur to selenium is from about 0.5:1 to about 2:1; and green light emitting quantum dots having a composition different from the blue light emitting quantum dots, wherein an amount of the green light emitting quantum dots is greater than or equal to about 1 weight percent and less than or equal to about 7 weight percent, based on a total weight of the blue light emitting quantum dots.

According to an embodiment, a mixture of quantum dots that can emit light of different colors (e.g., two or more colors) may be used to realize, e.g., form, a single pixel capable of emitting a predetermined color of light. According to an embodiment, a display device is provided including a pixel capable of emitting light of a desired color. According to an embodiment, the display device may emit light (e.g., a blue light or a green light) that is adjusted to satisfy a desired color coordination, for example, with an increased brightness.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
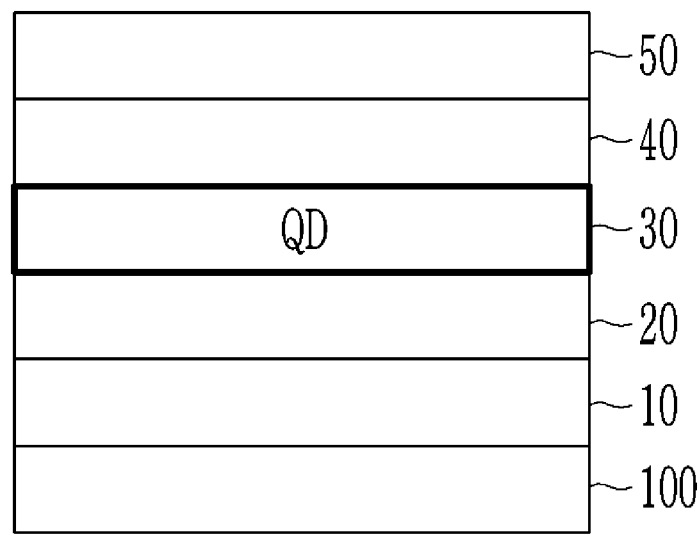
FIG. 1 is a schematic cross-sectional view of a display device of an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a general (i.e., a non-technical) dictionary shall not be interpreted ideally or exaggeratedly unless clearly defined herein. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise. Thus, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein a, e.g., at least one, of hydrogen atoms thereof is replaced by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxyl group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—COOR, wherein R is a C1 to C6 an alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount, e.g., weight, of cadmium (or other harmful heavy metal) may be present or, if present, an amount, e.g., weight, of cadmium (or other harmful heavy metal) may be less than or equal to a detection limit or as an impurity level of a given analysis tool (e.g., an inductively coupled plasma atomic emission spectroscopy).

As used herein, the term "quantum dot" refers to a nanostructure (for example, a semiconductor-based nanocrystal particle that exhibits quantum confinement or exciton confinement. The quantum dot is a type of light emitting nanostructure (for example capable of emitting light upon an energy excitation). As used herein, unless defined otherwise, a shape of the "quantum dot" may not be particularly limited. As used herein, a nanostructure is a structure having a, e.g., at least one, region or characteristic dimension with a dimension of less than or equal to about 500 nm. In an embodiment, a dimension (or an average) of the nanostructure(s) is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any suitable shape. The nanostructure may include a nanowire, a nanorod, a nanotube, a branched nanostructure, a nanotetrapod, a nanotripod, a nanobipod, a nanocrystal, a nanodot, a multi-pod-type shape such as a shaping having at least two pods (e.g., of different sizes), or the like, and is not limited thereto. The nanostructure can be, e.g., substantially crystalline, substantially monocrystalline, polycrystalline, fully or partially amorphous, or a combination thereof.

As used herein, color reproducibility based on the Digital Cinema Initiatives (DCI) standard refers to matching a color gamut of an electroluminescent display device with respect to a color gamut according to each standard (e.g., a ratio of an area of the matching portion to a total area of the standard color gamut) in a Commission internationale de l'éclairage (CIE) chromaticity diagram (i.e., color coordinate).

A luminescent nanostructure such as a quantum dot (hereinafter, also referred to as a quantum dot) may have a size smaller than a diameter of the Bohr excitation in the bulk crystal of the same material and may show, e.g., exhibit, a quantum confinement effect. The quantum dot may emit light emission corresponding to a bandgap energy of the core of the nanocrystal by controlling a size of an emission center of the nanocrystal.

The bandgap energy of a quantum dot may change according to size, structure, and composition of the quantum dot. For example, as the size of a quantum dot increases, the quantum dot may have a narrowed bandgap energy and an increased emission wavelength. Such semiconductor nanocrystals may be used as a light emitting material in various fields, e.g., as a display device, as an energy storage device, or a bio-luminescent device. Many quantum dots having electroluminescence properties suitable for actual application may include a toxic heavy metal such as cadmium, lead, mercury, or a combination thereof. In addition, in order to be applied to, e.g., used in, a quantum dot light emitting diode (QLED) display device, a quantum dot having a relatively narrow full width at half maximum (FWHM) and capable of emitting pure blue light (e.g., a photoluminescence (PL) peak around 455 nm) is desired.

In an embodiment, a cadmium free quantum dot including an indium phosphide may encounter a difficulty for the realization of, e.g., in emitting, a desired blue light, as an emission center (e.g., a core) of the cadmium free quantum dot including an indium phosphide may have a relatively small size (e.g., about 1 nm to about 2 nm). A ZnSe based, cadmium free quantum dot may emit light of a deep blue color. Quantum dots including ZnTeSe and a controlled amount, e.g., molar amount, of Te may emit blue light of a desired wavelength. However, as the amount, e.g., molar amount, of the tellurium is increased for, e.g., to provide, a blue light of a desired wavelength, the emission of the longer wavelength region, e.g., the greater wavelength, may also increase. Therefore, there remains a need to develop a display device that is configured to emit light of a desired color coordination in the CIE1931 or a XY color space.

In an embodiment, a display device including a luminescent device that is configured to emit light of a desired wavelength by the application of a voltage for example without a separate light source.

In an embodiment, an electroluminescent display device includes a red pixel, a green pixel, and a blue pixel. The display device includes a first electrode and a second electrode facing each other; and a quantum dot emission layer disposed between the first electrode and the second electrode. The first electrode may include an anode and the second electrode may include a cathode. The first electrode may include a cathode and the second electrode may include an anode. In the electroluminescent display device, the first electrode or the second electrode may be disposed on a substrate (e.g., a transparent substrate). The transparent substrate may be a light extraction face (see FIG. 1 and FIG. 2)

In the display device of an embodiment, the quantum dot emission layer includes a red emission layer disposed in the red pixel, a green emission layer disposed in the green pixel, and a blue emission layer disposed in the blue pixel. The red emission layer includes a plurality of (e.g., non-cadmium)

red light emitting quantum dots. The green emission layer includes a plurality of (e.g., non-cadmium) green light emitting quantum dots. The blue emission layer includes a plurality of (e.g., non-cadmium) blue light emitting quantum dots.

Figure 2:
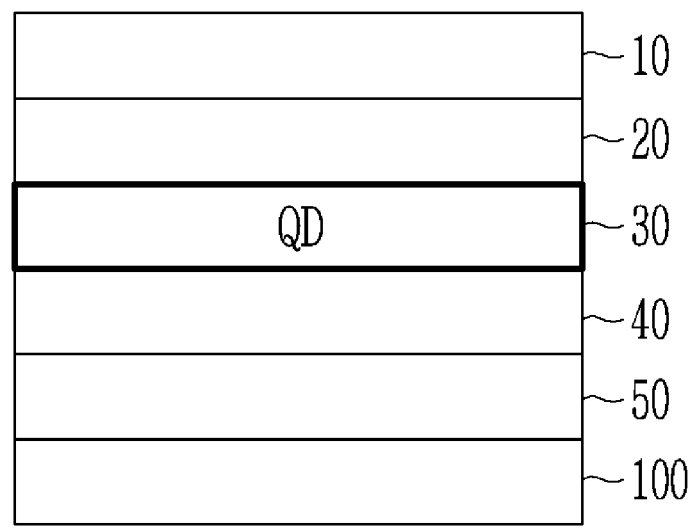
FIG. 2 is a schematic cross-sectional view of a display device of an embodiment.

A schematic cross-section view of a display device of an embodiment is illustrated in FIG. 1 and FIG. 2. Referring to FIG. 1 and FIG. 2, a quantum dot emission layer 30 may be disposed between a first electrode (e.g., an anode) 10 and a second electrode (e.g., a cathode) 50.

The cathode 50 may include an electron injection conductor. The anode 10 may include a hole injection conductor. Work functions of the electron injection conductor included in the cathode and the hole injection conductor of the anode may be appropriately selected and are not particularly limited. For example, the cathode may have a work function which is less than a work function of the anode. In an embodiment, the anode may have a work function which is less than a work function of the cathode.

The electron injection conductor and the hole injection conductor may each independently include a metal-based material (e.g., a metal, a metal compound, an alloy, or a combination thereof), other conductive material, or a combination thereof. The metal may comprise aluminum, magnesium, tungsten, nickel, cobalt, platinum, palladium, or calcium, or a combination thereof. The metal compound or other conductive material may be a metal oxide, such as gallium indium oxide or indium tin oxide (ITO), or a material having metallic properties, such as a conductive polymer, such as polyethylene dioxythiophene, e.g., a polymeric material (for example, having a relatively high work function, but is not limited thereto.

The first electrode, the second electrode, or a combination thereof may be a light transmitting electrode or a transparent electrode. In an embodiment, both of the first electrode and the second electrode may be light transmitting electrodes. The first electrode and the second electrode may each independently be patterned. The first electrode or the second electrode may each independently be disposed on a substrate. The substrate may be an insulating substrate. The substrate may be optically transparent, e.g., having a transparency of greater than or equal to about 50%, greater than or equal to about 60%, greater than or equal to about 70%, greater than or equal to about 80%, greater than or equal to about 85%, or greater than or equal to about 90%, and less than or equal to about 99%, or less than or equal to about 95%. The substrate may include a region for a red pixel, a region for a green pixel, and a region for a blue pixel. A thin film transistor may be disposed in each region of the substrate, and a source electrode of the thin film transistor, a drain electrode of the thin film transistor, or a combination thereof may be electrically connected to the first electrode or the second electrode.

The light transmitting electrode may be disposed on a transparent substrate (e.g., insulating transparent substrate). The substrate may be rigid or flexible. The substrate may be a plastic, glass, or a metal.

The light transmitting electrode may comprise, for example, a transparent conductor, such as, for example, indium tin oxide (ITO) or indium zinc oxide (IZO), gallium indium tin oxide, zinc indium tin oxide, titanium nitride, polyaniline, LiF/Mg:Ag, a metal thin film, or a monolayer or multilayer of a metal such as Ag, Au, Pt, or a combination thereof, but is not limited thereto. In an embodiment in which the first electrode or the second electrode is a non-light transmitting electrode, it may comprise, for example, an opaque conductor, such as, for example, aluminum (Al), a lithium-aluminum (Li:Al) alloy, a magnesium-silver alloy (Mg:Ag), or lithium fluoride-aluminum (LiF:Al) compound.

A thickness of each of the electrodes (the first electrode, the second electrode, or each of the first electrode and the second electrode) is not particularly limited, and each may independently be selected taking into consideration device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm, but is not limited thereto. The thickness of the electrode may be less than or equal to about 100 micrometers (μm), for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The quantum dot emission layer 30 disposed between the first electrode and the second electrode (e.g., anode 10 and cathode 50) includes a plurality of quantum dots. In an embodiment, the plurality of quantum dots may not include cadmium, e.g., is cadmium-free. In an embodiment, a cadmium content of the plurality of quantum dots may be about 0.01 parts per million, e.g., by weight, (ppm) to about 100 ppm, or about 0.01 ppm to about 10 ppm, based on a total content, e.g., weight, of the plurality of quantum dots. The quantum dot emission layer may include a single or a plurality of (e.g., about 2 to about 10, or about 2 or greater or about 3 or greater) monolayer(s), each including a plurality of quantum dots. The plurality of quantum dots may include a quantum dot having a core-shell structure.

Figure 3A:
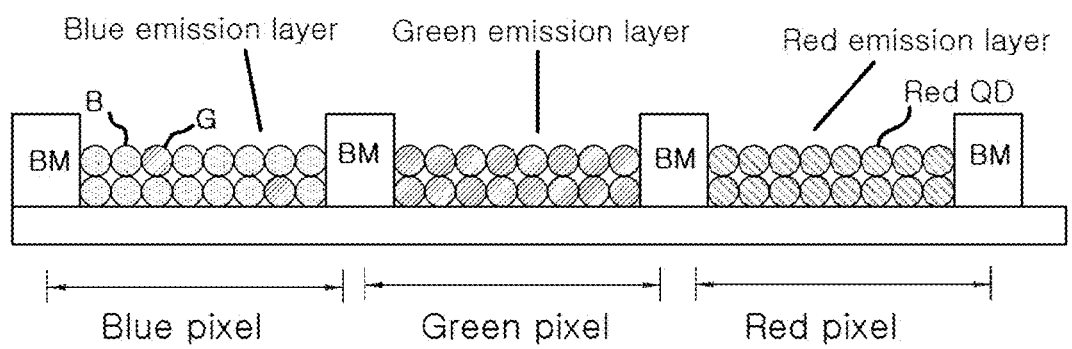
FIG. 3a is a schematic cross-sectional view of a quantum dot emission layer included in a display device of an embodiment.

The quantum dot emission layer may be patterned. In an embodiment, the patterned quantum dot emission layer includes a red emission layer disposed in the red pixel, a green emission layer disposed in the green pixel, and a blue emission layer disposed in the blue pixel. A black matrix (BM) may be disposed between the emission layers (e.g., between the red emission layer and the green emission layer, between the green emission layer and the blue emission layer, between the red emission layer and the blue emission layer, or a combination thereof). (See FIG. 3A and FIG. 3B) Each of the red emission layer, the green emission layer, and the blue emission layer may independently be optically isolated.

In a display device of an embodiment, the red pixel (or red light emitting quantum dots) may have a luminescent peak wavelength (e.g., an electroluminescent peak wavelength) of greater than or equal to 600 nm, greater than or equal to about 615 nm, greater than or equal to about 625 nm, or greater than or equal to about 628 nm, and less than or equal to about 640 nm, less than or equal to about 635 nm, or less than or equal to about 630 nm. The green pixel (e.g., the green emission layer) or the green light emitting quantum dots may have a luminescent peak wavelength (e.g., an electroluminescent peak wavelength) in a range of from about 500 nm to about 550 nm, from about 510 nm to about 540 nm, or from about 525 nm to about 536 nm (e.g., from about 526 nm to about 535 nm or from about 527 nm to about 534 nm). The green pixel (e.g., the green emission layer) or the green light emitting quantum dots may have a luminescent peak wavelength (e.g., an electroluminescent peak wavelength) of greater than or equal to about 524 nm, or greater than or equal to about 525 nm, and less than or equal to about 545 nm, or less than or equal to about 536 nm (e.g., from about 526 nm to about 545 nm, or from about 527 nm to about 535 nm). The green pixel (e.g., the green emission layer) or the green light emitting quantum dots may have a luminescent peak wavelength (e.g., an electroluminescent peak wavelength) of greater than or equal to about 520 nm, or greater than or equal to about 524 nm, and less than or equal to about 535 nm. The blue pixel (e.g., the blue emission layer) or the blue light emitting quantum dots may have a luminescent peak wavelength (e.g., an electroluminescent peak wavelength) of greater than or equal to about 420 nm, greater than or equal to about 430 nm, greater than or equal to about 435 nm, greater than or equal to about 440 nm, greater than or equal to about 445 nm, greater than or equal to about 450 nm, or greater than or equal to about 451 nm, and less than or equal to about 460 nm, less than or equal to about 458 nm, or less than or equal to about 455 nm.

A composition of the red light emitting quantum dots included in the red pixel (or the red emission layer) is not particularly limited. In an embodiment, at least a portion of the red light emitting quantum dots may include a (semiconductor nanocrystal) core including indium and phosphorus, and optionally further including zinc, and a (semiconductor nanocrystal) shell including zinc and sulfur, and optionally further including selenium. The shell may have a multi-layered shell wherein adjacent layers may have different composition. In the red light emitting quantum dots, the core may include an indium phosphide (InP) or an indium zinc phosphide (InZnP), or a combination thereof, and the shell may include ZnS, ZnSe, ZnSeS, or a combination thereof. The composition of the shell may vary in a radial direction.

In an embodiment, the red light emitting quantum dots may show, e.g., exhibit, a luminescent peak wavelength of greater than or equal to about 620 nm, greater than or equal to about 622 nm, greater than or equal to about 623 nm, greater than or equal to about 624 nm, greater than or equal to about 625 nm, greater than or equal to about 626 nm, or greater than or equal to about 627 nm, and less than or equal to about 650 nm, less than or equal to about 645 nm, less than or equal to about 640 nm, less than or equal to about 637 nm, or less than or equal to about 630 nm. The red-light emitting quantum dots may have a quantum yield of greater than or equal to about 80%, for example, greater than or equal to about 85%, greater than or equal to about 89%, or greater than or equal to about 90%. A shape of the red light emitting quantum dot is not particularly limited. The shape of the red light emitting quantum dot may include a sphere, a polyhedron, a multipod, or a combination thereof. A size (or an average size) of the red light emitting quantum dot(s) may be greater than or equal to about 5 nm, or greater than or equal to about 6 nm, and less than or equal to about 15 nm, less than or equal to about 10 nm, less than or equal to about 9 nm, or less than or equal to about 8.8 nm.

A quantum dot emission layer including cadmium free quantum dots may not emit light capable of realizing, e.g., exhibiting, a desired color coordination. Quantum dots including a zinc selenium telluride may emit blue light of a desired wavelength, but the present inventors have found that an increase of an amount, e.g., molar amount, of the tellurium may result in a wider luminescent peak thereof, and the resulting quantum dots may show, e.g., exhibit, an increased full width at half maximum (See FIG. 4)

In a display device of an embodiment, the blue emission layer may be configured to exhibit two different luminescent peaks each having a peak wavelength different from one another and optionally having a full width at half maximum different from one another, as the device is applied with a voltage, and emits blue light. In a display device of an embodiment, the green emission layer may be configured to exhibit two different luminescent peaks each having a peak wavelength different from one another and optionally having a full width at half maximum different from one another, as the device is applied with a voltage, and emits green light. Without wishing to be bound by any theory, it is understood that by including the aforementioned emission layers, the display device of an embodiment may emit light having a color coordination closer to or having a desired value. Without wishing to be bound by any theory, it is understood that by including the aforementioned emission layers, the display device of an embodiment may emit, or have, improved brightness (or luminance).

In the display device of an embodiment, as a voltage is applied to the device, the blue emission layer is configured to show a blue luminescent peak and a first luminescent peak different from the blue luminescent peak, e.g., configured to exhibit a first emission spectrum including (or to emit a first light exhibiting) a blue luminescent peak and a first luminescent peak different from the blue luminescent peak, and a first wavelength difference between the blue luminescent peak and the first luminescent peak may be greater than or equal to about 20 nm, or greater than or equal to about 30 nm, and less than or equal to about 150 nm, or less than or equal to about 100 nm.

In addition to the blue light emitting quantum dots B, the blue emission layer may further include a plurality of first quantum dots G that are configured to emit a light of (e.g., a light exhibiting) the first luminescent peak (e.g., a green light). The first quantum dots may have a composition different from the blue light emitting quantum dots (see FIG. 3A)

The blue light emitting quantum dots may include a zinc chalcogenide including tellurium. The blue light emitting quantum dots may include a zinc chalcogenide not including tellurium. In the blue light emitting quantum dots, an amount, e.g., molar amount, of tellurium may be less than an amount, e.g., molar amount, of selenium. In the blue light emitting quantum dots, an amount, e.g., molar amount, of tellurium may be less than an amount, e.g., molar amount, of sulfur. In the blue light emitting quantum dots, an amount, e.g., molar amount, of tellurium may be less than an amount, e.g., molar amount, of selenium and sulfur.

The blue light emitting quantum dots may have a core shell structure including a semiconductor nanocrystal core and a shell disposed on the semiconductor nanocrystal core and having different composition from the semiconductor nanocrystal core. The semiconductor nanocrystal core may include zinc, tellurium, and selenium.

The semiconductor nanocrystal core (e.g., first semiconductor nanocrystal) may include a limited amount of tellurium. The core may include $ZnTe_xSe_{1-x}$ (wherein, x is greater than or equal to about 0 and less than or equal to about 0.1, or less than or equal to about 0.05). In the core, an amount of tellurium with respect to one mole of selenium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.015 moles, or greater than or equal to about 0.02 moles. In the core, an amount of tellurium with respect to one mole of selenium may be less than or equal to about 0.06 moles, less than or equal to about 0.053 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, or less than or equal to about 0.035 moles.

The semiconductor nanocrystal shell may include zinc (Zn), selenium (Se), and sulfur (S). The shell may be a multi-layered shell. The multi-layered shell may include a first shell layer disposed directly on the core, and an outer layer (e.g., an outermost layer) disposed on the first shell layer, wherein the first shell layer may include ZnSeS and the outer layer or the outermost layer may include ZnS. The semiconductor nanocrystal shell may include a gradient alloy and a sulfur amount, e.g., molar amount, may have a concentration gradient, wherein the sulfur amount, e.g., molar amount, increases (or decrease) in a direction, e.g., radial direction, away from the core.

In the blue light emitting quantum dots, a mole ratio of the tellurium to selenium (e.g., as measured by inductively coupled plasma-atomic emission spectroscopy (ICP-AES)) may be less than or equal to about 0.1:1, less than or equal to about 0.07:1, less than or equal to about 0.06:1, less than or equal to about 0.05:1, less than or equal to about 0.04:1, less than or equal to about 0.03:1, less than or equal to about 0.02:1, less than or equal to about 0.01:1, less than or equal to about 0.009:1, or less than or equal to about 0.0089. In the blue light emitting quantum dots, a mole ratio of the tellurium to selenium may be greater than or equal to about 0.0001:1, greater than or equal to about 0.0005:1, greater than or equal to about 0.0009:1, greater than or equal to about 0.001:1, greater than or equal to about 0.002:1, greater than or equal to about 0.003:1, greater than or equal to about 0.004:1, or greater than or equal to about 0.005:1. The mole ratio of tellurium to selenium may be from about 0.004:1 to about 0.025:1. In the blue light emitting quantum dots, an amount, e.g., molar amount, of zinc may be greater than that of selenium. As determined by an ICP-AES analysis, in the blue light emitting quantum dot(s), an amount, e.g., molar amount, of zinc may be greater than an amount, e.g., molar amount, of selenium and an amount, e.g., molar amount, of the selenium may be greater than an amount, e.g., molar amount, of the tellurium.

In the blue light emitting quantum dot(s), a mole ratio of selenium to zinc may be, for example, as determined by an ICP-AES, less than or equal to about 1:1, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, or less than or equal to about 0.4:1. The mole ratio of selenium to zinc may be greater than or equal to about 0.05:1, greater than or equal to about 0.1:1, or greater than or equal to about 0.2:1.

In the blue light emitting quantum dot(s), a mole ratio of tellurium to zinc may be, for example, as determined by an ICP-AES, less than or equal to about 0.03:1, less than or equal to about 0.027:1, less than or equal to about 0.025:1, less than or equal to about 0.02:1, less than or equal to about 0.019:1, less than or equal to about 0.018:1, less than or equal to about 0.017, less than or equal to about 0.016:1, less than or equal to about 0.015:1, less than or equal to about 0.01:1, less than or equal to about 0.009:1, less than or equal to about 0.008:1, less than or equal to about 0.007:1, less than or equal to about 0.006:1, or less than or equal to about 0.005:1. A mole ratio of tellurium to zinc may be greater than or equal to about 0.0005:1, greater than or equal to about 0.0009:1, greater than or equal to about 0.001:1, greater than or equal to about 0.002:1, greater than or equal to about 0.003:1, greater than or equal to about 0.005:1, or greater than or equal to about 0.009:1. In the blue light emitting quantum dot(s) of an embodiment, an amount of tellurium may be less than or equal to about 1 weight percent (wt %), based on a total weight of the quantum dots. In an embodiment, the blue light emitting quantum dot(s) may not include cadmium, lead, or a combination thereof. In an embodiment, the blue light emitting quantum dot(s) or the green light emitting quantum dots may not include copper, manganese, or a combination thereof.

In the blue light emitting quantum dot(s), a mole ratio of sulfur to zinc may be greater than or equal to about 0.1:1, greater than or equal to about 0.15:1, greater than or equal to about 0.2:1, or greater than or equal to about 0.3:1. In the blue light emitting quantum dot(s), a mole ratio of sulfur to zinc may be less than or equal to about 0.9:1, less than or equal to about 0.8:1, less than or equal to about 0.7:1, or less than or equal to about 0.6:1. In the blue light emitting quantum dot(s), a mole ratio of sulfur and selenium to zinc ((Se+S):Zn) may be greater than or equal to about 0.3:1, greater than or equal to about 0.4:1, or greater than or equal to about 0.5:1. In the blue light emitting quantum dot(s), a mole ratio of sulfur and selenium to zinc may be less than or equal to about 1:1, or less than 1:1, and greater than or equal to about 0.5:1, greater than or equal to about 0.6:1, greater than or equal to about 0.7:1, or greater than or equal to about 0.8:1. In the blue light emitting quantum dot(s), a mole ratio of sulfur to selenium may be greater than or equal to about 0.5:1 and less than or equal to about 2:1.

A shape of the blue light emitting quantum dot(s) is not particularly limited. The shape of the quantum dots may be a sphere, a polyhedron, a multi-pod, or a combination thereof. The blue light emitting quantum dot(s) may have a shape of a multipod. The multi-pod may have at least two (e.g., at least three or at least four) branches and a valley between the branches.

An average size of the core may be greater than or equal to about 2 nm, greater than or equal to about 3 nm, or greater than or equal to about 4 nm. The average size of the core may be less than or equal to about 6 nm, for example, less than or equal to about 5 nm. The blue light emitting semiconductor nanocrystal may have a size (or an average size, hereinafter referred to as size) of greater than or equal to about 3 nm, for example, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. The blue light emitting semiconductor nanocrystal may have a size of less than or equal to about 50 nm, less than or equal to about 40 nm, less than or equal to about 35 nm, less than or equal to about 30 nm, for example, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm. The size (or the average size) of the luminescent nanostructure may be obtained from an electron microscopy image. The size (or the average size) may be a diameter or an equivalent diameter (or an average diameter value) obtained from the electron microscopy image. In an embodiment, the size (or the average size) of the luminescent nanostructure(s) may be a nominal (calculated) size that can be calculated from a compositional analysis (e.g., an inductively coupled plasma atomic emission spectroscopy analysis).

The blue light emitting quantum dots according to an embodiment may have a (photo- or electro-) luminescence peak wavelength of greater than or equal to about 435 nm, e.g., greater than or equal to about 440 nm, greater than or equal to about 446 nm, greater than or equal to about 449 nm, or greater than or equal to about 450 nm, and less than or equal to about 470 nm, less than or equal to about 465 nm, less than or equal to about 460 nm, or less than or equal to about 455 nm.

The maximum luminescence peak of the blue light emitting quantum dot(s) may have a full width at half maximum (FWHM) of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. The full width at half maximum of the blue light emitting quantum dots may be greater than or equal to about 12 nm, greater than or equal to about 20 nm, greater than or equal to about 25 nm, or greater than or equal to about 26 nm, e.g., about 2 nm to about 50 nm, about 4 nm to about 45 nm, or about 6 nm to about 40 nm.

The blue light emitting quantum dots may have a quantum yield of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%, greater than or equal to about 70%, or greater than or equal to about 71%. The blue light emitting quantum dots may have a quantum yield of greater than or equal to about 80%, greater than or equal to about 90%, greater than or equal to about 95%, greater than or equal to about 99%, or 100%, e.g., a quantum efficiency of about 60% to about 99.9%, about 70% to about 99%, or about 75% to about 98%.

In an embodiment, in the blue light emission layer, a first wavelength difference between the blue luminescent peak and the first luminescent peak may be greater than or equal to about 25 nm, greater than or equal to about 30 nm, greater than or equal to about 35 nm, greater than or equal to about 40 nm, greater than or equal to about 45 nm, greater than or equal to about 50 nm, greater than or equal to about 55 nm, greater than or equal to about 60 nm, greater than or equal to about 65 nm, greater than or equal to about 70 nm, or greater than or equal to about 75 nm. The first wavelength difference between the blue luminescent peak and the first luminescent peak may be less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, or less than or equal to about 50 nm.

The first luminescent peak may be present in a wavelength region longer than the blue luminescent peak, e.g., a wavelength of the first luminescent peak may be greater than a wavelength of the blue luminescent peak. The first luminescent peak may be present in a green light wavelength region. The green light wavelength region may be greater than or equal to about 490 nm, greater than or equal to about 500 nm, greater than or equal to about 510 nm, greater than or equal to about 515 nm, greater than or equal to about 520 nm, greater than or equal to about 525 nm, greater than or equal to about 530 nm, or greater than or equal to about 535 nm. The green light wavelength region may be less than or equal to about 560 nm, less than or equal to about 555 nm, less than or equal to about 550 nm, less than or equal to about 545 nm, less than or equal to about 540 nm, less than or equal to about 535 nm, less than or equal to about 530 nm, or less than or equal to about 525 nm.

In an embodiment, a plurality of the first quantum dots included in the blue light emission layer may be configured to emit green light. The plurality of the first quantum dots may include a Group III-V compound including indium and phosphorus, and optionally further including zinc; or a zinc selenide telluride; or a zinc telluride; or a combination thereof. The zinc selenide telluride may include $ZnTe_ySe_{1-y}$ (wherein y is greater than or equal to about 0.3, greater than or equal to about 0.4, greater than or equal to about 0.5, or greater than or equal to about 0.6, and less than or equal to about 0.9, less than or equal to about 0.8, or less than or equal to about 0.7). In an embodiment, the plurality of the first quantum dots (for example, being configured to emit green light) may include a semiconductor nanocrystal core and a semiconductor nanocrystal shell including a Group II-VI compound and disposed on the core. In an embodiment, the semiconductor nanocrystal core may include an indium phosphide, an indium zinc phosphide, or a combination thereof. In an embodiment, the semiconductor nanocrystal core may include a zinc selenide telluride (e.g., the $ZnTe_ySe_{1-y}$).

In an embodiment, the first quantum dots include zinc, selenium, and tellurium, and in the first quantum dots, a mole ratio of tellurium to selenium may be greater than or equal to about 0.1:1, or greater than or equal to about 0.15. In addition, details of the first quantum dots (for example, emitting green light) may be the same as details about the green light emitting quantum dots included in the green emission layer.

In the blue emission layer, an amount of the plurality of the first quantum dots may be, based on a total weight of the blue light emitting quantum dots, greater than or equal to about 0.1 wt %, greater than or equal to about 0.5 wt %, greater than or equal to about 1 wt %, greater than or equal to about 1.5 wt %, greater than or equal to about 2 wt %, greater than or equal to about 2.5 wt %, greater than or equal to about 3 wt %, or greater than or equal to about 3.5 wt %. In the blue emission layer, an amount of the plurality of the first quantum dots may be, based on a total weight of the blue light emitting quantum dots, less than or equal to about 10 wt %, less than or equal to about 9.5 wt %, less than or equal to about 9 wt %, less than or equal to about 8.5 wt %, less than or equal to about 8 wt %, less than or equal to about 7.5 wt %, less than or equal to about 7 wt %, or less than or equal to about 6.5 wt %.

In the blue emission layer, the blue light emitting quantum dots and the first quantum dots may be mixed at random (e.g., randomly in a thickness or plane direction or not divided in, e.g., into, separate layers or separate sections).

In the blue emission layer of the display device of an embodiment, an intensity ratio of the first luminescent peak to the blue luminescent peak may be greater than or equal to about 0.05:1. In the blue emission layer of the display device of an embodiment, an intensity ratio of the first luminescent peak to the blue luminescent peak may be 0.1:1, greater than or equal to about 0.12:1, greater than or equal to about 0.15:1, greater than or equal to about 0.17:1, greater than or equal to about 0.19:1, greater than or equal to about 0.2:1, greater than or equal to about 0.21:1, greater than or equal to about 0.23:1, greater than or equal to about 0.25:1, greater than or equal to about 0.27:1, greater than or equal to about 0.29:1, or greater than or equal to about 0.3:1. In the blue emission layer of the display device of an embodiment, an intensity ratio of the first luminescent peak to the blue luminescent peak may be less than or equal to 0.6:1, less than or equal to about 0.55:1, less than or equal to about 0.50:1, less than or equal to about 0.45:1, less than or equal to about 0.4:1, less than or equal to about 0.35:1, less than or equal to about 0.3:1, less than or equal to about 0.25:1, less than or equal to about 0.2:1, or less than or equal to about 0.15:1.

In an embodiment, the blue emission layer may have a Cx value of greater than or equal to about 0.14, greater than or equal to about 0.142, greater than or equal to about 0.145, greater than or equal to about 0.147, greater than or equal to about 0.149, greater than or equal to about 0.15, greater than or equal to about 0.152, greater than or equal to about 0.155, greater than or equal to about 0.157, or greater than or equal to about 0.16, in a CIE color coordination. In an embodiment, the blue emission layer may have a Cx value of less than or equal to about 0.18, less than or equal to about 0.175, less than or equal to about 0.17, less than or equal to about 0.165, less than or equal to about 0.163, or less than or equal to about 0.16, in a CIE color coordination.

In an embodiment, the blue emission layer may have a Cy value of greater than or equal to about 0.06, greater than or equal to about 0.065, greater than or equal to about 0.067, greater than or equal to about 0.069, or greater than or equal to about 0.070 in a CIE color coordination, less than or equal to about 0.11, less than or equal to about 0.105, less than or equal to about 0.095, less than or equal to about 0.09, less than or equal to about 0.087, less than or equal to about 0.085, less than or equal to about 0.083, or less than or equal to about 0.085 in a CIE color coordination, or a combination thereof.

In a display device of an embodiment, for example, the green emission layer disposed in the green pixel may be configured to exhibit a green luminescent peak and a second luminescent peak different from the green luminescent peak, e.g., configured to exhibit a second emission spectrum including (or to emit a second light exhibiting) a green luminescent peak and a second luminescent peak different from the green luminescent peak, and a second wavelength difference between the green luminescent peak and the second luminescent peak may be greater than or equal to about 10 nm and less than or equal to about 150 nm.

In an embodiment, the second luminescent peak may be present in a wavelength region longer than the green luminescent peak, e.g., a wavelength of the second luminescent peak may be greater than a wavelength of the green luminescent peak. In an embodiment, the second luminescent peak may be present in a wavelength region shorter than the green luminescent peak, e.g., a wavelength of the second luminescent peak may be less than a wavelength of the green luminescent peak In an embodiment, the second luminescent peak may have a luminescent peak wavelength in a range of from about 480 nm to about 580 nm, about 485 nm to about 575 nm, about 490 nm to about 570 nm, about 495 nm to about 565 nm, about 500 nm to about 560 nm, about 505 nm to about 555 nm, about 510 nm to about 550 nm, about 515 nm to about 545 nm, about 520 nm to about 540 nm, about 525 nm to about 535 nm, about 530 nm to about 538 nm, or a combination thereof. In an embodiment, the second luminescent peak may be in a blue light wavelength region.

The second wavelength difference between the green luminescent peak and the second luminescent peak may be greater than or equal to about 15 nm, greater than or equal to about 20 nm, greater than or equal to about 25 nm, greater than or equal to about 30 nm, greater than or equal to about 35 nm, greater than or equal to about 40 nm, greater than or equal to about 45 nm, or greater than or equal to about 50 nm. The second wavelength difference between the green luminescent peak and the second luminescent peak may be less than or equal to about 120 nm, less than or equal to about 110 nm, less than or equal to about 100 nm, less than or equal to about 90 nm, less than or equal to about 80 nm, less than or equal to about 70 nm, less than or equal to about 65 nm, less than or equal to about 60 nm, less than or equal to about 55 nm, less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, or less than or equal to about 18 nm.

Figure 3B:
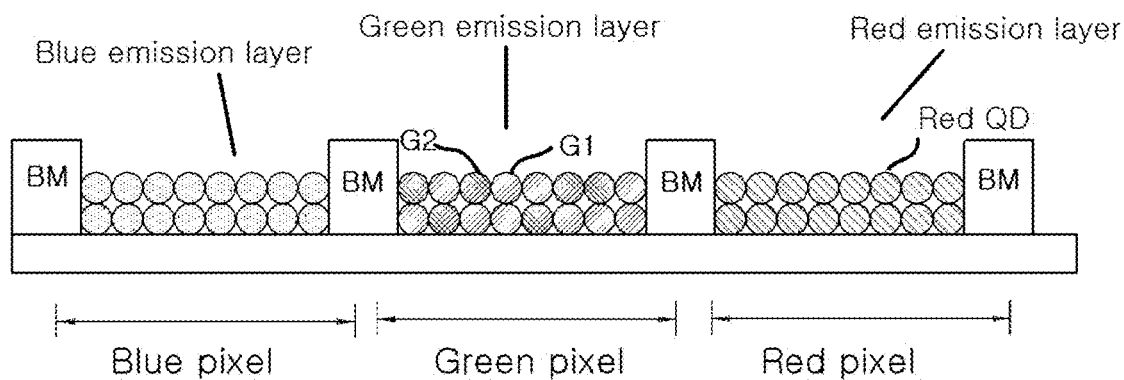
FIG. 3b is a schematic cross-sectional view of a quantum dot emission layer included in a display device of an embodiment.

The green emission layer may include green light emitting quantum dots G1 and a plurality of second quantum dots G2 that are configured to emit light of (e.g., a second light exhibiting) the second luminescent peak, and have a composition different from the green light emitting quantum dots (see FIG. 3B).

In the green emission layer, the green light emitting quantum dot(s) may include a Group III-V compound including indium and phosphorus, and optionally further including zinc; or a zinc selenide telluride (for example represented by $ZnTe_ySe_{1-y}$), or a zinc telluride; or a combination thereof. In the green emission layer, the second quantum dot(s) may include a Group III-V compound including indium and phosphorus, and optionally further including zinc; or a zinc selenide telluride (for example represented by $ZnTe_xSe_{1-x}$ or $ZnTe_ySe_{1-y}$), or a zinc telluride; or a combination thereof.

In an embodiment, in the green emission layer, the green light emitting quantum dot(s) (or the second quantum dots) may have a core shell structure including a semiconductor nanocrystal core and a semiconductor nanocrystal shell disposed on the core and having a composition different from the core.

The semiconductor nanocrystal core may include the Group III-V compound; or a zinc selenide telluride represented by $ZnTe_ySe_{1-y}$ (wherein y is greater than or equal to about 0.3, greater than or equal to about 0.4, greater than or equal to about 0.5, or greater than or equal to about 0.6, and less than or equal to about 0.9, less than or equal to about 0.8, or less than or equal to about 0.7); or a zinc telluride; or a combination thereof. The semiconductor nanocrystal shell may include a zinc chalcogenide (a zinc selenide, a zinc sulfide, or a combination thereof).

The Group III-V compound may include indium and phosphorus, and optionally further include zinc. The core may include InP or InZnP. The core may include the zinc selenide telluride represented by $ZnTe_xSe_{1-x}$ or $ZnTe_ySe_{1-y}$.

The shell or the zinc chalcogenide may include zinc and a chalcogen element (e.g., sulfur, selenium, or a combination thereof). The shell may be a multilayered shell including two or more layers. In the multilayered shell, adjacent layers may have different compositions from each other. The shell or the zinc chalcogenide may include a zinc selenide, a zinc sulfide, a zinc selenide sulfide (ZnSeS), or a combination thereof. In the green light emitting quantum dot(s) or the second quantum dot(s), a thickness of the shell may be greater than or equal to about 1 nm, greater than or equal to about 1.5 nm, greater than or equal to about 2 nm, or greater than or equal to about 2.5 nm, and less than or equal to about 5 nm, less than or equal to about 4 nm, less than or equal to about 3 nm, less than or equal to about 2 nm, or less than or equal to about 1.5 nm. In an embodiment, the shell may have a composition that varies in a radial direction. In an embodiment, the shell may include ZnSeS and an amount, e.g., molar amount, (a concentration) of sulfur may increase in a radial direction (e.g., toward a surface thereof) and an outermost layer of the shell may include (or may essentially consist of) ZnS. In an embodiment, an inner layer of the shell may include (or may essentially consist of) a zinc selenide (ZnSe) or ZnSeS.

The green light emitting quantum dot (semiconductor nanocrystal particle) may exhibit a quantum yield of greater than or equal to about 80%, or greater than or equal to about 85%.

A shape of the green light emitting quantum dot(s) or the second quantum dot(s) is not particularly limited, and may be a sphere, a polyhedron, a multipod, or a composition. A size (or an average size) of the green light emitting quantum dot(s) or the second quantum dot(s) may be greater than or equal to about 3 nm, greater than or equal to about 4 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, or greater than or equal to about 8 nm, and less than or equal to about 50 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, or less than or equal to about 5.5 nm.

In an embodiment, the green light emitting quantum dots or the second quantum dots may include zinc, selenium, and tellurium, and in the green light emitting quantum dots or the second quantum dots, a mole ratio of tellurium to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. In the green light emitting quantum dots or the second quantum dots, a mole ratio of tellurium to selenium (Te:Se) may be less than or equal to about 4:1, less than or equal to about 3.5:1, less than or equal to about 3:1, less than or equal to about 2.5:1, less than or equal to about 2:1, less than or equal to about 1.5:1, or less than or equal to about 1:1.

In an embodiment, the green light emitting quantum dots or the second quantum dots may not include manganese, copper, or a combination thereof.

In an embodiment, the green light emitting quantum dots or the second quantum dots may include sulfur and selenium, and a mole ratio of sulfur to selenium (S:Se) may be greater than 0:1, for example, greater than or equal to about 0.5:1, greater than or equal to about 0.8:1, greater than or equal to about 1:1, or greater than or equal to about 1.2:1, and less than or equal to about 8:1, less than or equal to about 7.5:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.7:1, less than or equal to about 3:1, or less than or equal to about 2.5:1.

In an embodiment, an intensity ratio of the second luminescent peak to the green luminescent peak may be greater than or equal to about 0.05:1, greater than or equal to about 0.1:1, greater than or equal to about 0.15:1, greater than or equal to about 0.2:1, or greater than or equal to about 0.25:1. In an embodiment, an intensity ratio of the second luminescent peak to the green luminescent peak may be less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, or less than or equal to about 0.15:1.

In a display device of an embodiment, a thickness of the quantum dot emission layer may be selected appropriately. In an embodiment, the quantum dot emission layer may include a monolayer of quantum dots. In an embodiment, the light emitting layer 13 may include one or more, two or more, three or more, or four or more, and 20 or less, 10 or less, 9 or less, 8 or less, 7 or less, or 6 or less monolayers of quantum dots. The light emitting layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The quantum dot emission layer 13 may have a thickness of, for example, about 10 nm to about 150 nm, about 20 nm to about 100 nm, or about 30 nm to about 50 nm.

The forming of the quantum dot emission layer may include obtaining a composition including quantum dots and coating or depositing the composition on a substrate or a charge auxiliary layer by an appropriate method (e.g., by spin coating, inkjet printing, etc.).

The red light emitting quantum dot, the green light emitting quantum dot, and the blue light emitting quantum dot each having the aforementioned structure/composition and the first quantum dot or the second quantum dot may be produced by an appropriate method (e.g., a chemical wet method).

In an embodiment, a method for producing a quantum dot of a core shell structure may include
    obtaining the core as disclosed herein;
    preparing a first shell precursor solution including a first shell precursor including a metal (e.g., zinc) and an organic ligand;

preparing a second shell precursor including a non-metal element (e.g., sulfur, selenium, or a combination thereof); and heating the first shell precursor solution to a reaction temperature (e.g., greater than or equal to about 180° C., greater than or equal to about 200° C., greater than or equal to about 240° C., or greater than or equal to about 280° C., and less than or equal to about 360° C., less than or equal to about 340° C., or less than or equal to about 320° C.), and adding the core and the second shell precursor to the first shell precursor solution to form a shell of a second semiconductor nanocrystal on the core. The method may further include separation of the core after synthesis of the core from a reaction system that is used for synthesis of the core, and preparation of a core solution (or core dispersion) by dispersing the synthesized core in an organic solvent.

In an embodiment, in order to form the shell, the solvent and optionally the ligand compound are heated to a predetermined temperature (e.g., 100° C. or greater), optionally under vacuum, disposed in an inert gas atmosphere, and then heated to a predetermined temperature (e.g., 100° C. or greater) again. Subsequently, the core is added and the shell precursors are injected sequentially or simultaneously, and the reaction is performed by heating at a predetermined reaction temperature. A mixture of the shell precursors having different ratios may be sequentially injected during the reaction time.

The core may be appropriately produced. In an embodiment, the core for the red light emitting or green light emitting quantum dot may be produced by obtaining a first mixture including an indium precursor, an organic ligand, an organic solvent, and optionally a zinc precursor; pre-treating the first mixture at a temperature of greater than or equal to about 100° C. (e.g., 110° C. or greater) (e.g., under vacuum) as desired; preparing a phosphorus precursor stock solution including a phosphorus precursor and an organic solvent; heating the first mixture to a reaction temperature; adding the phosphorus precursor stock solution into the first mixture; and performing a reaction.

Types of the indium precursor are not particularly limited and may be appropriately selected. For example, the indium precursor may include an indium powder, an alkylated indium, e.g., a C1 to C4 indium compound (such as trimethyl indium), a C1 to C6 indium alkoxide, indium hydroxide, an indium carboxylate (e.g., indium acetate), indium nitrate, indium perchlorate, indium sulfate, indium acetylacetonate, indium halide, indium cyanide, indium oxide, or indium peroxide, or a combination thereof.

Types of the zinc precursor are not particularly limited and may be appropriately selected. The zinc precursor may be the same as described herein.

Types of the organic ligand and the organic solvent are not particularly limited and may be appropriately selected. Types of the organic ligand and the organic solvent are described herein.

Types of the phosphorus precursor are not particularly limited and may be appropriately selected. For example, the phosphorus precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof, but is not limited thereto.

Ratios among each compound in the reaction system (for example, the indium precursor, the zinc precursor, the phosphor precursor, the organic ligand, and the organic solvent) may be appropriately selected taking into consideration the composition of a desired quantum dot. The reaction time and temperature may be appropriately selected taking into consideration the size of the core to be synthesized. For example, the reaction temperature for a core synthesis may be greater than or equal to about 270° C., and less than or equal to about 360° C., but is not limited thereto. The reaction time for the core synthesis may be greater than or equal to about 5 minutes, and less than about 1 hour, but is not limited thereto.

The core for the blue light emitting quantum dot may be produced by a method including
    providing a zinc precursor solution including a zinc precursor and an organic ligand;
    preparing a selenium precursor and a tellurium precursor; and
    heating the zinc precursor solution to a first reaction temperature, adding the selenium precursor and the tellurium precursor together with an organic ligand to the zinc precursor solution to form a first semiconductor nanocrystal core including zinc, selenium, and tellurium.

The zinc precursor may include a Zn metal powder, ZnO, an alkylated Zn compound (e.g., a C2 to C30 dialkyl zinc such as diethyl zinc), a C1 to C6 Zn alkoxide (e.g., zinc ethoxide), a Zn carboxylate (e.g., zinc acetate), Zn nitrate, Zn perchlorate, Zn sulfate, Zn acetylacetonate, a Zn halide (e.g., zinc chloride), Zn cyanide, Zn hydroxide, or a combination thereof. The zinc precursor solution may include an organic ligand in an organic solvent. The organic ligand may include a fatty acid, an amine compound, or a combination thereof. A concentration of the zinc precursor and a concentration of the organic ligand in the zinc precursor solution are not particularly limited and may be appropriately selected.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto. The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

An amount of the selenium precursor for forming the core may be greater than or equal to about 0.5 moles, greater than or equal to about 1 mole, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 15 moles, greater than or equal to about 20 moles, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, based on 1 mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, less than or equal to about 55 moles, less than or equal to about 30 moles, less than or equal to about 20 moles, less than or equal to about 10 moles, or less than or equal to about 1 moles, based on 1 mole of the tellurium precursor. Within the foregoing ranges of the amount, the core having the aforementioned composition may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours but is not limited thereto. By controlling the reaction time, the size of the core may be controlled.

Hereinafter, a shell precursor of the ZnSeS shell will be described in further detail, but the present disclosure is not limited thereto, and appropriate shell precursor may be selected in accordance with a shell composition.

In an embodiment, the first shell precursor may include zinc. The first shell precursor including zinc may be a zinc powder, a C2 to C30 alkylated zinc compound (e.g., a C2 to C30 dialkyl zinc), a C1 to C6 zinc alkoxide, a zinc carboxylate, a zinc nitrate, a zinc perchlorate, a zinc sulfate, a zinc acetylacetonate, a zinc halide, a zinc cyanide, a zinc hydroxide, ZnO, a zinc peroxide, or a combination thereof, but is not limited thereto. Examples of the first shell precursor may be dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The second shell precursor includes selenium, sulfur, or a combination thereof. The sulfur-containing precursor of the second shell precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The selenium-containing precursor of the second shell precursor may be selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

In an embodiment, after synthesis of the core and during a shell growth, a solution including the shell precursor may be added to a reaction system in a stepwise manner in order for a composition of the shell to be varied. For example, a shell of a ternary compound may be formed, and addition order and amounts, and reaction times of a first element precursor (e.g., a metal element such as Zn), a second element precursor (e.g., a first non-metal element such as sulfur), and a third element precursor (e.g., a second non-metal element such as Se) solutions may be selected. For example, the core may be added to the first element precursor solution, the second element precursor solution may be added thereto, and then a reaction may be performed for a predetermined time. Subsequently, the third element precursor solution and the second element precursor solution may be added to the reaction system in a form of a mixture or individually, and then a reaction is performed. Herein, addition times of the third element precursor solution and the second element precursor solution and a ratio of the third element precursor and the second element precursor in the reaction system may be controlled.

A lattice mismatch at the interface of the core and shell may be controlled at an appropriate time by controlling addition times of the third element precursor solution and the second element precursor solution and a ratio of the precursors in the reaction system. In addition, growth energy at the surface may be controlled by changing a reaction temperature and a type of the third element precursor.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as a phenyl ether or a benzyl ether, or a combination thereof.

The organic ligand may coordinate, e.g., bind to, the surface of the produced nanocrystal and render, e.g., allow, the nanocrystal to be well dispersed in the solution, as well as may have an effect on light emitting and electrical characteristics of the nanocrystal. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, $R_2POOH$ (wherein, R and R' are each independently a substituted or unsubstituted C1 (or C6 or higher, or C10 or higher) to C40 aliphatic hydrocarbon, or a substituted or unsubstituted C6 to C40 aromatic hydrocarbon, or a combination thereof), or a combination thereof. The ligand may be used alone or in a mixture of two or more different compounds.

Specific examples of the organic ligand compound may be methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; a phosphine such as methylphosphine, ethylphosphine, propylphosphine, butylphosphine, pentylphosphine, tributylphosphine, or trioctylphosphine; a phosphine oxide compound such as methylphosphine oxide, ethylphosphine oxide, propylphosphine oxide, butylphosphine oxide, or trioctylphosphine oxide; a diphenylphosphine or triphenylphosphine compound, or an oxide compound thereof; or phosphonic acid, and the like, but are not limited thereto. The organic ligand compound may be used alone or in a mixture of two or more different compounds. In an embodiment, the organic ligand compound may be a combination of RCOOH and an amine (e.g., $RNH_2$, $R_2NH$, $R_3N$, or a combination thereof (wherein each R is independently a substituted or unsubstituted C1 (or C6 or higher, or C10 or higher) to C40 aliphatic hydrocarbon, or a substituted or unsubstituted C6 to C40 aromatic hydrocarbon, or a combination thereof)).

After the completion of the reaction, a non-solvent is added to the reaction products, and the nanocrystal particles coordinated with, e.g., bound to, the ligand compound may be isolated. The non-solvent may be a polar solvent that is miscible with the solvent used in a core formation reaction, a shell formation reaction, or a combination thereof and is not capable of dispersing the produced nanocrystals therein. The non-solvent may be selected depending on the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Isolation of the nanocrystal particles may involve centrifugation, sedimentation, chromatography, or distillation. The separated nanocrystal particles may be added to a washing solvent and washed, if desired. Types of the washing solvent are not particularly limited and a solvent having a similar solubility parameter to that of the ligand may be used, and examples thereof may include hexane, heptane, octane, chloroform, toluene, benzene, and the like.

The quantum dot of an embodiment may not be readily dispersible in water, any of the foregoing listed non-solvents, or a combination thereof. The quantum dots of an embodiment may be water-insoluble. The quantum dots may be dispersed in the aforementioned organic solvent. In an embodiment, the quantum dots may be dispersed in a C6 to C40 aliphatic hydrocarbon, a C6 to C40 aromatic hydrocarbon, or a combination thereof.

The electroluminescent display device may include a charge (hole or electron) auxiliary layer between the first electrode and the second electrode (e.g., an anode and a cathode). For example, the electroluminescent display device may include a hole auxiliary layer 20 between the anode 10 and the quantum dot emission layer 30, an electron auxiliary layer 40 between the cathode 50 and the quantum dot emission layer 30, or a combination thereof (see FIGS. 1 and 2). The device of an embodiment may further include a hole auxiliary layer.

In an embodiment, the hole auxiliary layer 12 may be disposed between the first electrode 11 and the emission layer 13. The hole auxiliary layer 12 may have one layer or two or more layers, and may include, for example, a hole injection layer (HIL), a hole transport layer (HTL), an electron (or hole) blocking layer, or a combination thereof. The hole auxiliary layer 12 may be a single component layer or a multi-layered structure wherein adjacent layers have different substances.

The hole auxiliary layer 12 may have a highest occupied molecular orbital (HOMO) energy level that may match a HOMO energy level of the emission layer 13 and may facilitate mobility of holes from the hole auxiliary layer 12 into the emission layer 13. In an embodiment, the hole auxiliary layer 12 may include a hole injection layer proximate to the first electrode 11 and a hole transport layer proximate to the emission layer 13.

A material included in the hole auxiliary layer 12 (for example, a hole transporting layer or a hole injection layer or a hole blocking layer (HBL)) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N', N'-tetrakis(4-methoxyphenyl)-benzidine (TPD), 4,4'-bis[N-(1-naphthyl)-N-phenyl-amino]biphenyl (α-NPD), m-MT-DATA (4,4',4"-tris[phenyl(m-tolyl)amino]triphenylamine), 4,4',4"-tris(N-carbazolyl)-triphenylamine (TCTA), 1,1-bis [(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer(s), a thickness of each layer may be appropriately selected depending on the desired characteristics of each layer. For example, the thickness of each layer may be greater than or equal to about 5 nm, greater than or equal to about 10 nm, greater than or equal to about 15 nm, or greater than or equal to about 20 nm, and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In an embodiment, the electron auxiliary layer 14 may be disposed between the emission layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be selected appropriately and may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5, 8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-quinolinolato)indium ($Inq_3$), bis(8-hydroxyquinoline) zinc ($Znq_2$), bis(2-(2-hydroxyphenyl)benzothiazolate) zinc (Zn $(BTZ)_2$), bis(10-hydroxybenzo[h]quinolinato)beryllium ($BeBq_2$), 8-(4-(4,6-di(naphthalen-2-yl)-1,3,5-triazin-2-yl) phenyl)quinolone (ET204), 8-hydroxyquinolinato lithium (Liq), an n-type metal oxide (e.g., ZnO, $HfO_2$, etc.), or a combination thereof, but is not limited thereto.

In an embodiment, the electron auxiliary layer 14 may include an electron transport layer. The ETL may include a plurality of nanoparticles.

The nanoparticles may include a metal oxide including zinc.

The metal oxide may include zinc oxide, zinc magnesium oxide, or a combination thereof. The metal oxide may include $Zn_{1-x}M_xO$ (wherein M is Mg, Ca, Zr, W, Li, Ti, Y, Al, or a combination thereof and $0 \leq x \leq 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15.

An absolute value of a lowest unoccupied molecular orbital (LUMO) of quantum dots included in the emission layer may be smaller than an absolute value of LUMO of the metal oxide. In an embodiment, an absolute value of LUMO of quantum dots may be larger than an absolute value of LUMO of a metal oxide ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm, and less than or equal to about 10 nm, less than or equal to about 9 nm, less than or equal to about 8 nm, less than or equal to about 7 nm, less than or equal to about 6 nm, or less than or equal to about 5 nm.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In an embodiment, the device includes a normal, e.g., non-inverted, structure. In a device according to an embodiment, an anode 10 disposed on a transparent substrate 100 may include a metal oxide-based transparent electrode (e.g., an ITO electrode) and a cathode 50 facing the anode may include a metal (e.g, Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the transparent electrode 10 and the emission layer 30. An electron auxiliary layer 40 such as an electron injection layer/transport layer may be disposed between the quantum dot emission layer 30 and the cathode 50 (see FIG. 1).

A device according to an embodiment has an inverted structure. Herein, the cathode 50 disposed on a transparent substrate 100 may include a metal oxide-based transparent electrode (e.g., ITO) and the anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer 40 (e.g., an electron transport layer (ETL)). A hole auxiliary layer 20 (e.g., a hole transport layer (HTL) including TFB, PVK, or a combination thereof, a hole injection layer (HIL) including $MoO_3$ or another p-type metal oxide, or a combination thereof) may be disposed between the metal anode 10 and the quantum dot emission layer 30 (see FIG. 2).

The device of an embodiment may be prepared in an appropriate manner. In an embodiment, the electroluminescent device may be prepared by forming a charge (e.g., hole) auxiliary layer on a substrate having an electrode thereon (e.g., via deposition or coating), forming an emissive layer including the quantum dots (e.g., a pattern of the aforementioned quantum dots) thereon (e.g., via deposition or coating), and forming an electrode (optionally together with a charge (e.g., electron) auxiliary layer) thereon (e.g., via deposition or coating). The formation of the electrode/hole auxiliary layer/electron auxiliary layer is not particularly limited and may be selected appropriately.

In a display device of an embodiment, the quantum dot emission layer (e.g., the blue emission layer or the green emission layer) may exhibit a maximum quantum efficiency (maximum EQE) of 7%, greater than or equal to about 7.5%, greater than or equal to about 7.7%, greater than or equal to about 8%, greater than or equal to about 8.5%, greater than or equal to about 9%, greater than or equal to about 9.6%, greater than or equal to about 9.7%, or greater than or equal to about 10%. The display device of an embodiment may exhibit an increased level of brightness by including the mixed emission layer disclosed herein.

In the display device of an embodiment, the green pixel or the green emission layer may show, e.g., exhibit, a brightness of greater than or equal to about 100,000 $cd/m^2$, greater than or equal to about 110,000 $cd/m^2$, greater than or equal to about 120,000 $cd/m^2$, greater than or equal to about 130,000 $cd/m^2$, greater than or equal to about 140,000 $cd/m^2$, greater than or equal to about 150,000 $cd/m^2$, greater than or equal to about 160,000 $cd/m^2$, or greater than or equal to about 170,000 $cd/m^2$.

In the display device of an embodiment, the blue pixel or the blue emission layer may show, e.g., exhibit, a brightness of greater than or equal to about 30,000 $cd/m^2$, greater than or equal to about 31,000 $cd/m^2$, greater than or equal to about 32,000 $cd/m^2$, greater than or equal to about 33,000 $cd/m^2$, greater than or equal to about 34,000 $cd/m^2$, greater than or equal to about 35,000 $cd/m^2$, greater than or equal to about 36,000 $cd/m^2$, greater than or equal to about 37,000 $cd/m^2$, greater than or equal to about 38,000 $cd/m^2$, greater than or equal to about 39,000 $cd/m^2$, greater than or equal to about 40,000 $cd/m^2$, greater than or equal to about 44,000 $cd/m^2$, greater than or equal to about 50,000 $cd/m^2$, or greater than or equal to about 52,000 $cd/m^2$.

Hereinafter, specific examples are illustrated. However, these examples are exemplary, and the present disclosure is not limited thereto.

EXAMPLES

Analysis Method
1. Photoluminescence Analysis

Photoluminescence (PL) spectra of the produced nanocrystals are obtained by using a Hitachi F-7000 spectrophotometer at an irradiation wavelength of 372 nanometers (nm).

2. Electroluminescence Spectroscopy Analysis

A current depending on a voltage is measured by using a Keithley 2635B source meter, while a voltage is applied thereto, and electroluminescence (EL) light emitting brightness is measured by using a CS2000 spectrometer.

A synthesis is performed under an inert gas atmosphere (e.g., flowing nitrogen), unless particularly mentioned. An amount of the precursor is a molar amount, unless particularly mentioned.

Synthesis Example 1

1. Production of ZnSe or ZnTeSe Core

Selenium and tellurium are respectively dispersed in trioctylphosphine (TOP) to prepare a 2 moles per liter (molar (M)) Se/TOP stock solution and a 0.1 M Te/TOP stock solution.

An amount of 0.125 millimoles (mmol) of zinc acetate, along with 0.25 mmol of oleic acid, 0.25 mmol of hexadecylamine, and 10 milliliters (mL) of trioctylamine, is put into a reactor, and is heated to 120° C. under vacuum. After 1 hour, the atmosphere of the reactor is substituted with nitrogen.

After heating the reactor to 300° C., the prepared Se/TOP stock solution and Te/TOP stock solution in a Te:Se mole ratio of 0:1, 1:33, 1:20, and 1:15 are rapidly injected thereinto, respectively and to carry out a reaction to prepare a core.

2. Formation of a Shell (e.g., ZnSeS/ZnS)

An amount of 1.8 mmol (0.336 grams (g)) of zinc acetate, 3.6 mmol (1.134 g) of oleic acid, and 10 mL of trioctylamine are put in a flask, and are treated under vacuum at 120° C. for 10 minutes. The flask is internally substituted with nitrogen ($N_2$), and is heated to 180° C. Then, the prepared core is added thereto within 10 seconds, subsequently, a predetermined amount of Se/TOP together with a zinc oleate is slowly injected thereinto, and the obtained mixture is heated to 280° C. Subsequently, a predetermined amount of S/TOP together with a zinc oleate is added thereto, and the obtained mixture is heated to 320° C. and reacted for 10 minutes. Consecutively, a mixed solution of a predetermined amount of Se/TOP and a predetermined amount of S/TOP together with a zinc oleate is slowly injected thereinto, and the obtained mixture is reacted again for 20 minutes.

When the reaction is complete, the reactor is cooled down, and the prepared nanocrystals are centrifuged with ethanol and dispersed in toluene.

Figure 4:
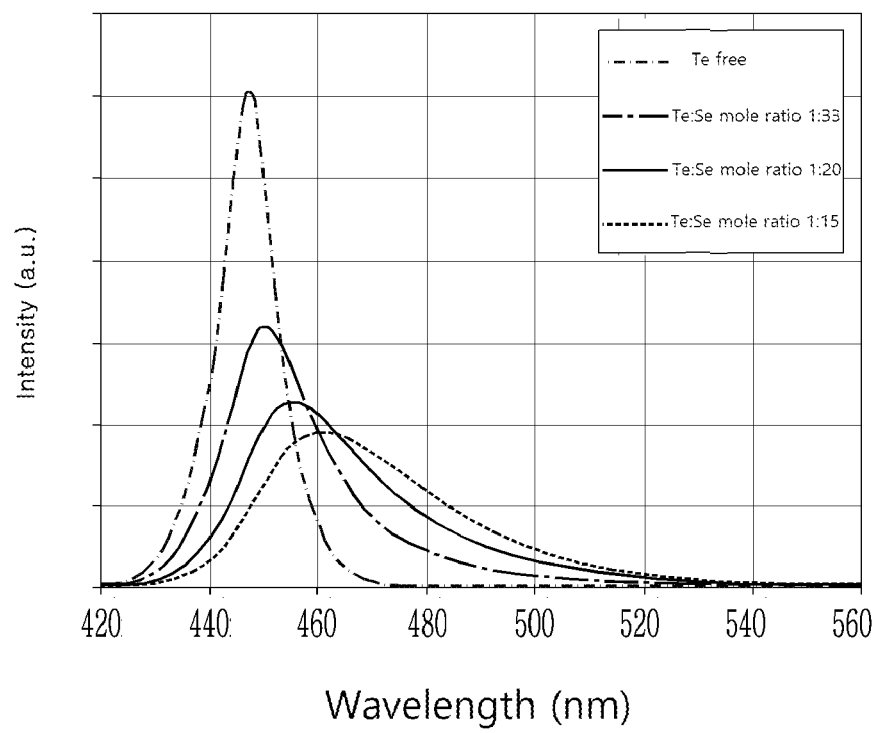
FIG. 4 is a graph of Intensity (arbitrary units (a.u.)) versus wavelength showing photoluminescent spectra of the quantum dots of the Examples.

Photoluminescence analyses of the quantum dots thus prepared, and the results are shown in FIG. 4.

The results of FIG. 4 confirm that as the amount of the tellurium increases, the wavelength of the quantum dots may be controlled, however, the full width at half maximum increases significantly and the emission at the longer wavelength region, e.g., the greater wavelength, increases, as well.

Synthesis Example 2

Indium acetate, zinc acetate, and palmitic acid are dissolved in 1-octadecene in a 200 milliliters (mL) reaction flask, subjected to a vacuum state at 120° C. for one hour. A mole ratio of indium to palmitic acid is 1:3. Per one mole of the indium precursor, one mole of the zinc acetate is used. The atmosphere in the flask is exchanged with $N_2$. After the reaction flask is heated to 280° C., a mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture then is rapidly cooled to room temperature and acetone is added thereto to produce nanocrystals, which are then separated by centrifugation and dispersed in toluene to obtain a toluene dispersion of the InP core nanocrystals. The amount of the $TMS_3P$ is about 0.75 moles per one mole of indium. A (average) size of the InZnP core thus obtained is about 2.1 nm.

Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctylamine and the solution is subjected to vacuum at 120° C. for 10 minutes. The atmosphere in the reaction flask is replaced with $N_2$. While the resulting solution is heated to about 320° C., a toluene dispersion of the InZnP semiconductor nanocrystal core prepared in Reference Example 2 is injected thereto and a predetermined amount of Se/TOP stock solution is injected into the reaction flask in three separate injections. A reaction is carried out to obtain a reaction solution including a particle having a ZnSe shell disposed on the InZnP core.

Then, at the aforementioned reaction temperature, the S/TOP stock solution is injected to the reaction mixture. A reaction is carried out to obtain a resulting solution including a particle having a ZnS shell disposed on the ZnSe shell.

An excess amount of ethanol is added to the final reaction mixture including the resulting InZnP/ZnSe/ZnS quantum dots, which are then centrifuged. After centrifugation, the supernatant is discarded, and the precipitate is dried and dispersed in chloroform. It is confirmed that the obtained quantum dots emit green light.

Experimental Example 1

The color coordination realized, e.g., exhibited, by each of four types of the quantum dots prepared in Synthesis Example 1 is calculated and the results are shown in Table 1. The results of Table 1 confirm that the four types of blue quantum dots prepared in Synthesis Example 1 show, e.g., exhibit, a difference from the DCI blue light source color coordination Cx 0.15 Cy 0.06, and thus adjusting the color coordination by the increase of the amount of the tellurium has a limit in a color expression.

TABLE 1

| | Te mole ratio (Te:Se) | | | |
|---|---|---|---|---|
| | 0:1 | 1:33 | 1:20 | 1:15 |
| Cx | 0.159 | 0.15 | 0.14 | 0.132 |
| Cy | 0.018 | 0.046 | 0.075 | 0.101 |

Experimental Example 2

The emission layer including the blue quantum dots (Te:Se 0:1, Te free) or the blue quantum dots (Te:Se mole ratio 1:15), each prepared in Synthesis Example 1 and the emission layer including the blue quantum dot (Te free) and the green light emitting quantum dots (luminescent wavelength of about 545 nm) are prepared. For each of the emission layers thus prepared, optical properties and a relative color reproducibility are obtained by a simulation analysis and the results are shown in Table 2.

TABLE 2

| Emission layer | Relative luminance | Cx | Cy | Relative color reproducibility |
|---|---|---|---|---|
| Te free (Te:Se 0:1) | 58% | 0.150 | 0.046 | 0% |
| Te:Se mole ratio 1:15 | 100% | 0.132 | 0.101 | −14% |
| Te free 91% + green quantum dot (QD) 9% | 102% | 0.158 | 0.080 | −3.7% |

The results of Table 2 confirm that mixing with the green light emitting quantum dots can result in an increase of a freedom for adjusting the color coordination and an improvement of the brightness.

Experimental Example 3

The blue light emitting quantum dots (Te:Se mole ratio 1:33 or 1:20) are dispersed in octane to prepare a quantum dot dispersion, respectively. The blue light emitting quantum dots (Te:Se mole ratio 1:33) and the green light emitting quantum dots (QG) prepared from Synthesis Example 2 (1 weight percent (wt %), 3 wt %, 5 wt % or 7 wt %) are mixed and dispersed in octane to obtain quantum dot dispersion, respectively. Using each of the obtained quantum dot dispersions, an electroluminescent device is prepared in the following manner:

An indium tin oxide (ITO) electrode is deposited on a substrate, and a poly(3,4-ethylenedioxythiophene) polystyrene sulfonate (PEDOT:PSS) layer and a poly(9,9-dioctyl-fluorene-co-N-(4-butylphenyl)-diphenylamine) (TFB) (or poly(9-vinylcarbazole) (PVK)) layer are formed thereon by spin coating. On the TFB (or PVK) layer, octane dispersion of the quantum dots is spin-coated to obtain a quantum dot emission layer. On the quantum dot emission layer, a film based on crystalline zinc oxide nanoparticles (thickness: about 40 nm) is formed as the electron transport layer, and then, an Al electrode is deposited thereon.

Electroluminescence properties and luminescent spectrums are measured, while a voltage (0 to 7 volts (V)) is applied between the ITO electrode and the Al electrode. The electroluminescence properties and the luminescent spectrum are shown in Table 3 and FIG. 5.

TABLE 3

| | External Quantum Efficiency (EQE) (maximum) | Luminance Maximum (candelas per square meter ($cd/m^2$)) |
|---|---|---|
| Te:Se mole ratio 1:33 only | 9.6% | 35,400 |
| Te:Se mole ratio 1:33 + QG 1 wt % | 9.8% | 44,600 |
| Te:Se mole ratio 1:33 + QG 3 wt % | 10.2% | 53,000 |
| Te:Se mole ratio 1:33 + QG 5 wt % | 9.9% | 68,500 |
| Te:Se mole ratio 1:33 + QG 7 wt % | 9.3% | 80,900 |

Figure 5:
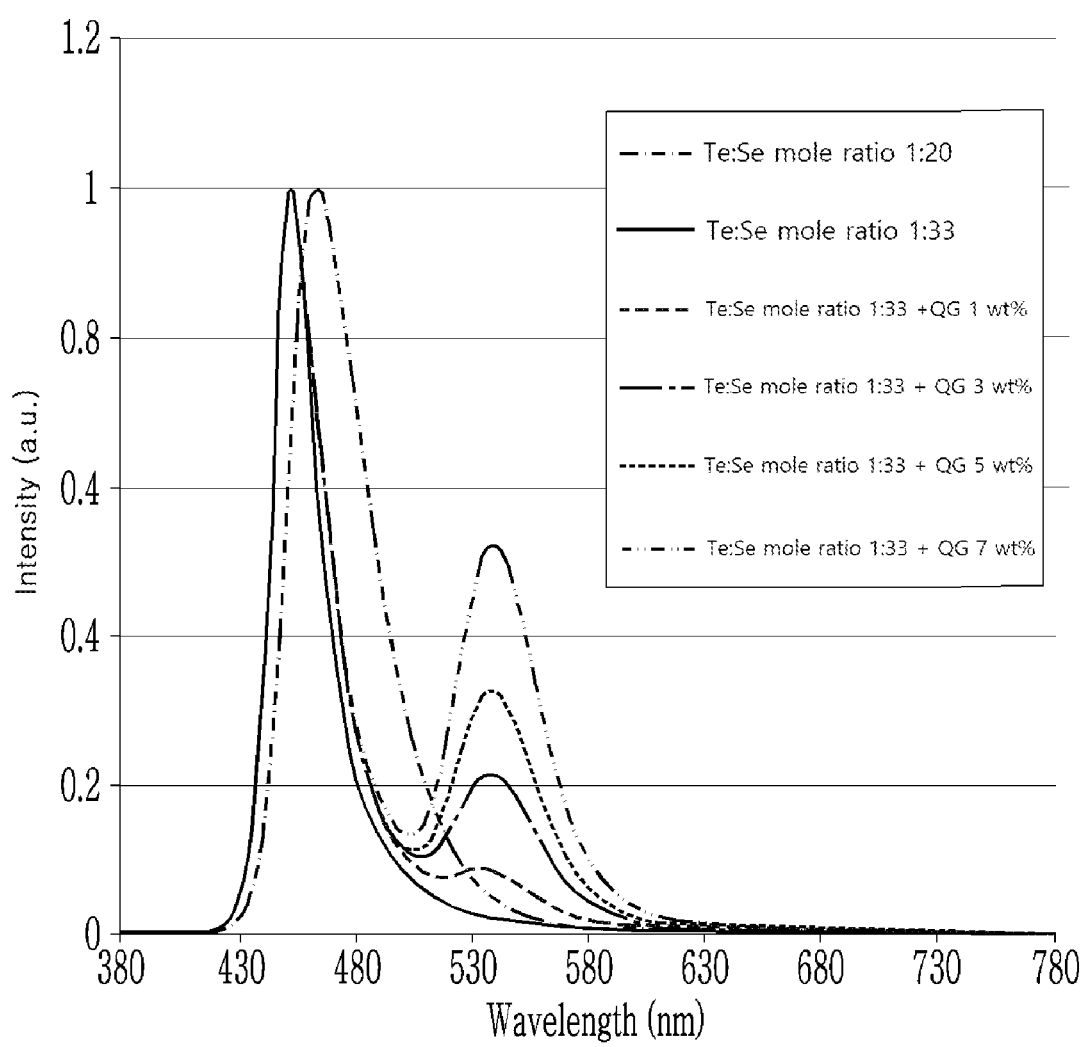
FIG. 5 is a graph of Intensity (a.u.) versus wavelength showing electroluminescent spectra of the blue light emission layer in a display device of an embodiment.

The results of FIG. 5 confirm that the blue emission layer including a mixture of the green light emitting quantum dots (QG) and the blue light emitting quantum dots may show, e.g., exhibit, a blue luminescent peak and a green luminescent peak on the voltage application, e.g., upon the application of voltage. The results of Table 3 confirm that the blue emission layer including a mixture of green light emitting quantum dots (QG) and blue light emitting quantum dots may exhibit improved brightness.

The color coordinations for the prepared emission layers are measured and the results confirm that by the introduction of the green light emitting quantum dots, the Cx and the Cy can be adjusted.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent display device, comprising:
a first electrode and a second electrode facing each other; and
a quantum dot emission layer disposed between the first electrode and the second electrode, the quantum dot emission layer not comprising cadmium,
wherein the quantum dot emission layer comprises
a red emission layer comprising red light emitting quantum dots, the red emission layer disposed in a red pixel,
a green emission layer comprising green light emitting quantum dots, the green emission layer disposed in a green pixel, and
a blue emission layer comprising blue light emitting quantum dots, the blue emission layer disposed in a blue pixel,
wherein the blue emission layer is configured to exhibit a first emission spectrum including a blue luminescent peak and a first luminescent peak different from the blue luminescent peak, and a first wavelength difference between the first luminescent peak and the blue luminescent peak is greater than or equal to about 20 nanometers and less than or equal to about 150 nanometers.

2. The electroluminescent display device of claim 1, wherein the first wavelength difference between the first luminescent peak and the blue luminescent peak is greater than or equal to about 30 nanometers and less than or equal to about 130 nanometers.

3. The electroluminescent display device of claim 1, wherein a wavelength of the first luminescent peak is greater than a wavelength of the blue luminescent peak.

4. The electroluminescent display device of claim 1, wherein the green emission layer is configured to exhibit a second emission spectrum including a green luminescent peak and a second luminescent peak different from the green luminescent peak, and a second wavelength difference between the second luminescent peak and the green luminescent peak is greater than or equal to about 10 nanometers and less than or equal to about 150 nanometers and wherein the second wavelength difference between the second luminescent peak and the green luminescent peak is greater than or equal to about 15 nanometers and less than or equal to about 50 nanometers.

5. The electroluminescent display device of claim 4, wherein a wavelength of the second luminescent peak is less than a wavelength of the green luminescent peak.

6. The electroluminescent display device of claim 1, wherein an intensity ratio of the first luminescent peak to the blue luminescent peak is greater than or equal to about 0.05:1 and less than or equal to about 0.6:1.

7. The electroluminescent display device of claim 6, wherein an intensity ratio of the first luminescent peak to the blue luminescent peak is greater than or equal to about 0.0:1; and
wherein the blue emission layer is configured to exhibit a Cx value of greater than equal to about 0.14 and less than or equal to about 0.18, or the blue emission layer is configured to exhibit a Cy value of greater than or equal to about 0.06 and less than or equal to about 0.11.

8. The electroluminescent display device of claim 1, wherein the blue emission layer is configured to have a maximum luminance of greater than or equal to about 36,000 candelas per square meter.

9. The electroluminescent display device of claim 1, wherein the green emission layer is configured to have a maximum luminance of greater than or equal to about 100,000 candelas per square meter.

10. The electroluminescent display device of claim 1, wherein the blue emission layer further comprises a plurality of first quantum dots that are configured to emit a light exhibiting the first luminescent peak, and the first quantum dots have a composition different from the blue light emitting quantum dots.

11. The electroluminescent display device of claim 1, wherein the blue light emitting quantum dots comprise a zinc chalcogenide comprising tellurium.

12. The electroluminescent display device of claim 10, wherein the plurality of the first quantum dots comprises
    a Group III-V compound comprising indium and phosphorus, and optionally further comprising zinc; or
    a zinc selenide telluride represented by $ZnTe_ySe_{1-y}$ (wherein y is greater than or equal to about 0.3 and less than or equal to about 0.9); or
    a zinc telluride; or
    a combination thereof.

13. The electroluminescent display device of claim 10, wherein in the blue emission layer, an amount of the plurality of the first quantum dots is greater than or equal to about 0.1 weight percent and less than or equal to about 10 weight percent, based on a total weight of the blue light emitting quantum dots.

14. The electroluminescent display device of claim 10, wherein in the blue emission layer, an amount of the plurality of the first quantum dots is greater than or equal to about 1 weight percent and less than or equal to about 7 weight percent, based on a total weight of the blue light emitting quantum dots.

15. The electroluminescent display device of claim 10, wherein in the blue emission layer, the blue light emitting quantum dots and the first quantum dots are mixed together.

16. The electroluminescent display device of claim 1, wherein the green emission layer further comprises a plurality of second quantum dots that are configured to emit a light exhibiting the second luminescent peak, and the second quantum dots have a composition different from the green light emitting quantum dots.

17. The electroluminescent display device of claim 16, wherein the green light emitting quantum dots or the second quantum dots comprise
    a Group III-V compound comprising indium and phosphorus, and optionally further comprising zinc; or
    a zinc selenide telluride; or
    a zinc telluride; or
    a combination thereof.

18. The electroluminescent display device of claim 16, wherein in the green emission layer, an amount of the plurality of the second quantum dots is greater than or equal to about 1 weight percent and less than or equal to about 7 weight percent, based on a total weight of the green light emitting quantum dots.

19. An electroluminescent display device, comprising:
    a first electrode and a second electrode facing each other; and
    a quantum dot emission layer disposed between the first electrode and the second electrode, the quantum dot emission layer not comprising cadmium,
    wherein the quantum dot emission layer comprises
        a red emission layer comprising red light emitting quantum dots, the red emission layer disposed in a red pixel,
        a green emission layer comprising green light emitting quantum dots, the green emission layer disposed in a green pixel, and
        a blue emission layer comprising blue light emitting quantum dots, the blue emission layer disposed in a blue pixel,
    wherein the green emission layer is configured to exhibit a second emission spectrum including a green luminescent peak and a second luminescent peak different from the green luminescent peak, and a second wavelength difference between the second luminescent peak and the green luminescent peak is greater than or equal to about 10 nanometers and less than or equal to about 150 nanometers, and
    wherein a wavelength of the second luminescent peak is less than a wavelength of the green luminescent peak.

20. The electroluminescent display device of claim 19, wherein the second wavelength difference between the second luminescent peak and the green luminescent peak is greater than or equal to about 15 nanometers and less than or equal to about 50 nanometers.

\* \* \* \* \*